US007294581B2

(12) United States Patent
Iyer et al.

(10) Patent No.: US 7,294,581 B2
(45) Date of Patent: Nov. 13, 2007

(54) METHOD FOR FABRICATING SILICON NITRIDE SPACER STRUCTURES

(75) Inventors: R. Suryanarayanan Iyer, St. Paul, MN (US); Sanjeev Tandon, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/253,229

(22) Filed: Oct. 17, 2005

(65) Prior Publication Data

US 2007/0087575 A1    Apr. 19, 2007

(51) Int. Cl.
    *H01L 21/30*      (2006.01)

(52) U.S. Cl. ................ 438/761; 438/758; 438/458; 257/E21.626

(58) Field of Classification Search ................ 438/758, 438/396, 761, 458
See application file for complete search history.

(56) References Cited

U.S. PATENT DOCUMENTS

| 5,122,889 | A | * | 6/1992 | Kaneko et al. ............ 349/52 |
| 5,541,434 | A | * | 7/1996 | Nicholls et al. ........... 257/383 |
| 5,670,431 | A | * | 9/1997 | Huanga et al. ............ 438/396 |
| 6,501,122 | B1 | | 12/2002 | Chan et al. |
| 6,713,127 | B2 | | 3/2004 | Subramony et al. |
| 6,821,825 | B2 | | 11/2004 | Todd et al. |
| 2003/0124818 | A1 | | 7/2003 | Luo et al. |
| 2003/0232514 | A1 | | 12/2003 | Kim et al. |
| 2004/0061118 | A1 | | 4/2004 | Yamazaki et al. |
| 2005/0109276 | A1 | | 5/2005 | Iyer et al. |
| 2006/0160341 | A1 | | 7/2006 | Lin et al. |

OTHER PUBLICATIONS

Smith, J. W., et al., "Thermal Chemical Vapor Deposition of Bis(Tertiary-Butylamino) Silane-baed Silicon Nitride Thin Films", *Journal of the Electrochemical Society*, 152 (4), (2005),G316-G321.
Tamaoki, Naoki, et al., "Low-Temperature Solution for Silicon Nitride LPCVD Using Cl-Free Inorganic Trisilylamine", in *Chemical Vapor Deposition XVI and EUROCVD 14*, vol. 1, Proceedings of the International Sumposium, M.D. Allendorf et al., Eds.; Proceedings Volumne Aug. 2003,(2003),693-700.

* cited by examiner

*Primary Examiner*—Asok K. Sarkar
*Assistant Examiner*—Victor V. Yevsikov
(74) *Attorney, Agent, or Firm*—Moser IP Law Group

(57) ABSTRACT

Embodiments of methods for fabricating a spacer structure on a semiconductor substrate are provided herein. In one embodiment, a method for fabricating a spacer structure on a semiconductor substrate includes providing a substrate containing a base structure over which the spacer structure is to be formed. The spacer structure may be formed over the base structure by depositing a first layer comprising silicon nitride on the base structure, depositing a second layer comprising a silicon-based dielectric material on the first layer, and depositing a third layer comprising silicon nitride on the second layer. The first, second, and third layers are deposited in a single processing reactor.

21 Claims, 3 Drawing Sheets

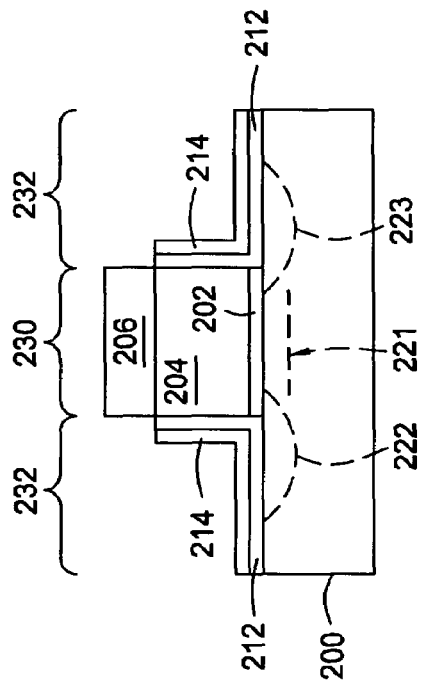
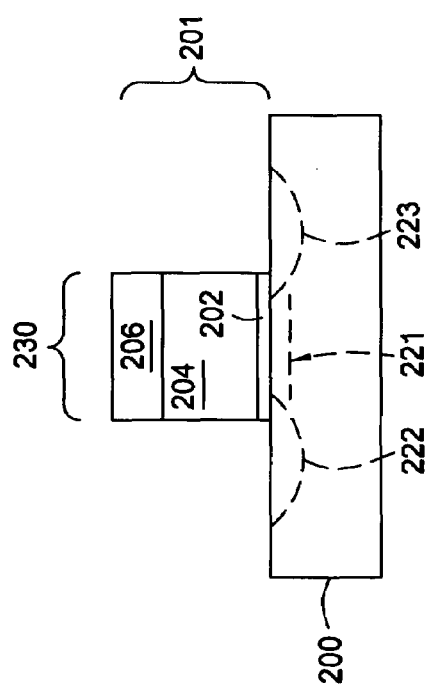
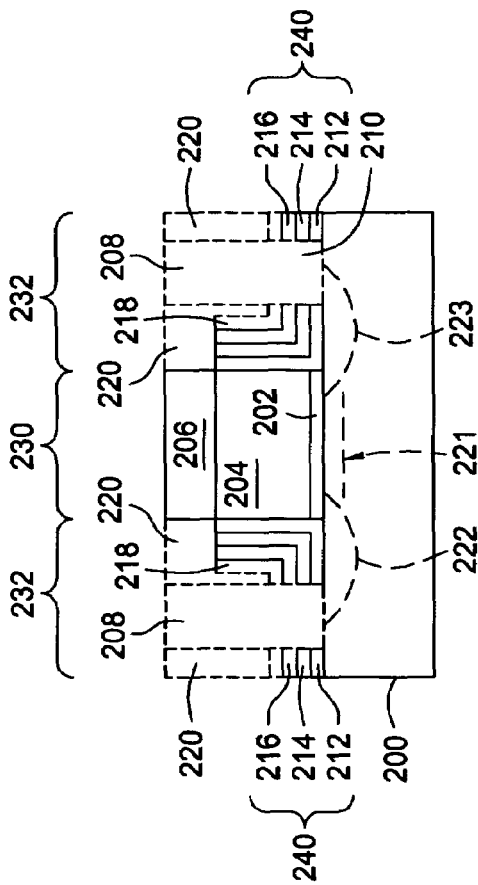
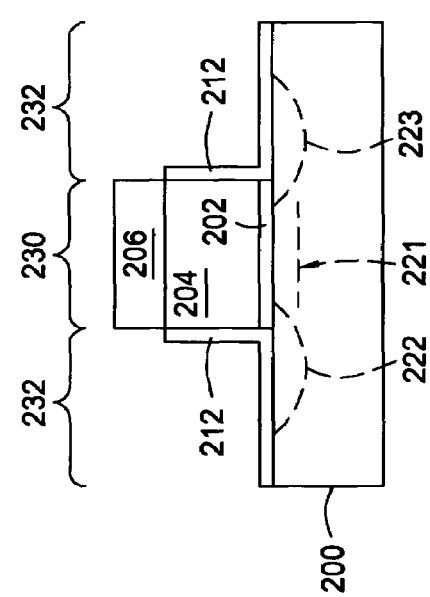

METHOD FOR FABRICATING SILICON NITRIDE SPACER STRUCTURES

BACKGROUND OF THE INVENTION

1. Field of the Invention

Embodiments of the invention generally relate to methods for depositing silicon-based materials. More specifically, the present invention relates to chemical vapor deposition techniques for fabricating multi-layer silicon nitride spacer structures.

2. Description of the Related Art

A spacer structure is an integral part of many devices formed on an integrated circuit (IC). In one example, spacer structures may be utilized in a field effect transistor (e.g., a complementary metal-oxide-semiconductor (CMOS) field effect transistor, and the like) to insulate and protect gate structures of the transistor from materials disposed adjacent to the gate structure. The spacer structure is disposed between various dielectric and conductive layers of the transistor and has complex interfacing requirements, for example, diffusion and barrier characteristics, intrinsic stress, bond strength, material compatibility, and the like.

Fabrication of spacer structures represents a challenging task and often the interfacing requirements are only partially met, or are met at the expense of low yield. In addition, present manufacturing techniques utilize different processing tools, resulting in extended duration and high cost of fabricating the spacer structures.

Thus, there is a need in the art for an improved method for fabricating a spacer structure of a field effect transistor.

SUMMARY OF THE INVENTION

Embodiments of methods for fabricating a spacer structure on a semiconductor substrate are provided herein. In one embodiment, a method for fabricating a spacer structure on a semiconductor substrate includes providing a substrate containing a base structure over which the spacer structure is to be formed. The spacer structure may be formed over the base structure by depositing a first layer comprising silicon nitride on the base structure, depositing a second layer comprising a silicon-based dielectric material on the first layer, and depositing a third layer comprising silicon nitride on the second layer. The first, second, and third layers are deposited in a single processing reactor.

BRIEF DESCRIPTION OF THE DRAWINGS

The teachings of the present invention will become apparent by considering the following detailed description in conjunction with the accompanying drawings, in which:

FIGS. 2A-2D, together, depict a series of schematic, cross-sectional views of a substrate where the spacer structure is fabricated in accordance with the method of FIG. 1.

Where possible, identical reference numerals are used herein to designate identical elements that are common to the figures. The images in the drawings are simplified for illustrative purposes and are not depicted to scale.

The appended drawings illustrate exemplary embodiments of the invention and, as such, should not be considered as limiting the scope of the invention that may admit to other equally effective embodiments.

DETAILED DESCRIPTION

The present invention is generally a method for fabricating spacer structures in integrated semiconductor circuits and devices.

Figure 1:
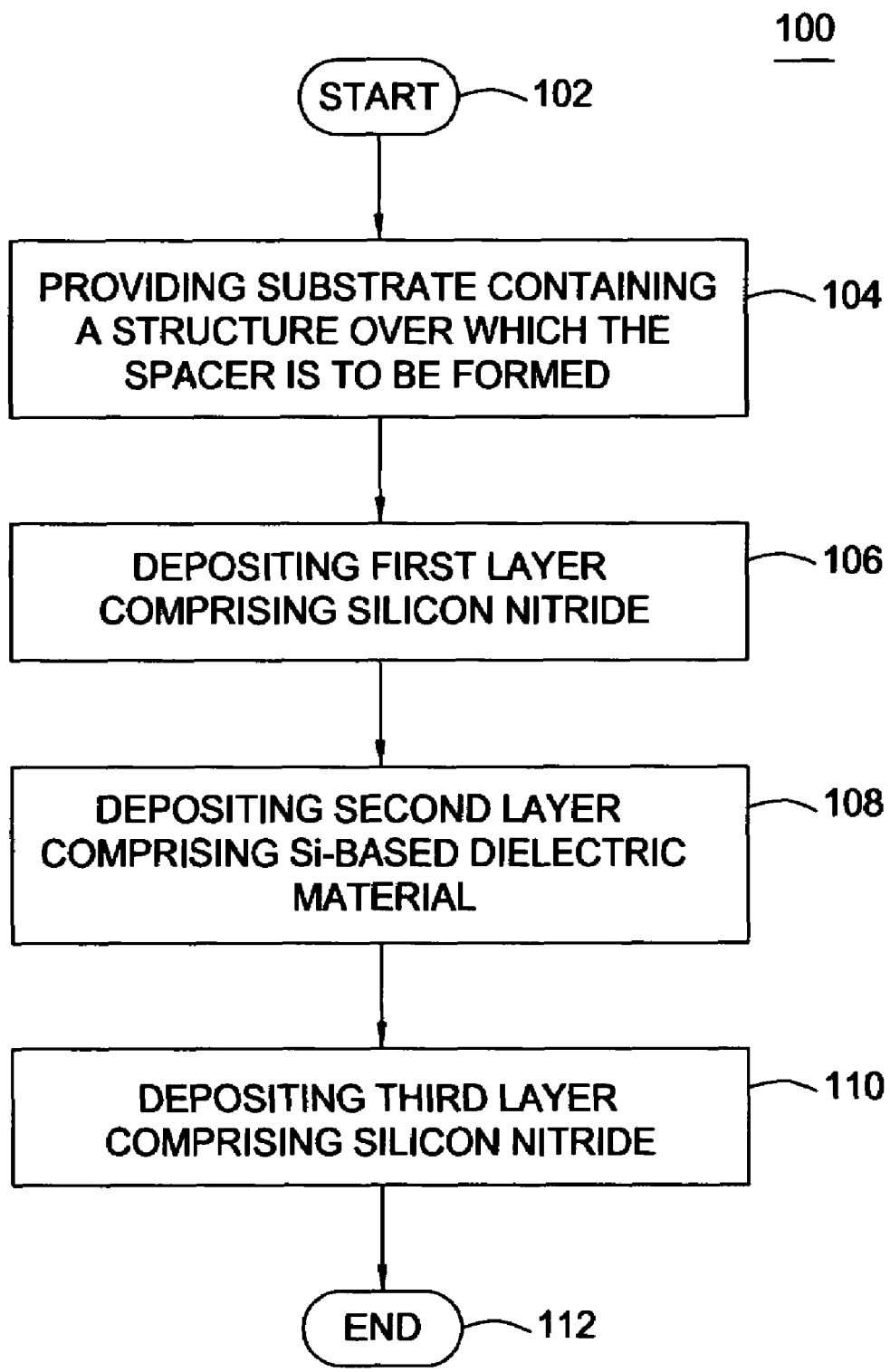
FIG. 1 depicts a flow diagram illustrating a method for fabricating a spacer structure of a field effect transistor in accordance with one embodiment of the present invention.

FIG. 1 depicts a flow diagram illustrating a method 100 for fabricating a spacer structure over a desired feature of a substrate in accordance with one embodiment of the present invention. The method 100 includes processing steps performed upon a substrate during fabrication of the spacer structure. Sub-steps and auxiliary procedures (e.g., process control sub-steps, lithographic routines, and the like) are well known in the art and, as such, are omitted herein. Spacer structures formed as described in the method 100 are suitable for use in connection with the fabrication of, for example, field effect transistors (FET), dynamic random access memory (DRAM), flash memory, and the like.

The steps of the method 100 can be performed using a low pressure chemical vapor deposition (LPCVD) reactor, among other suitable processing reactors known to those skilled in the art, such as chemical vapor deposition (CVD) reactors, atomic layer deposition (ALD) reactors, batch deposition reactors, and the like. An LPCVD reactor suitable for performing the inventive method is briefly discussed below with reference to FIG. 3. One LPCVD reactor suitable for performing the method 100 is a SiNgen® Plus LPCVD reactor available from Applied Materials, Inc. of Santa Clara, Calif.

FIGS. 2A-2D, together, depict a series of schematic, cross-sectional views of a substrate where a spacer structure is fabricated using one embodiment of the method of FIG. 1. The cross-sectional views in FIGS. 2A-2D relate to individual processing steps performed to fabricate a spacer structure in connection with the fabrication of a FET. The images in FIGS. 2A-2D are not depicted to scale and are simplified for illustrative purposes. To best understand the invention, the reader should simultaneously refer to FIGS. 1 and 2A-2D.

The method 100 starts at step 102 and proceeds to step 104, where a substrate 200 is provided (FIG. 2A). Embodiments of the substrate 200 include, but are not limited to, semiconductor wafers, such as crystalline silicon (e.g., Si<100> or Si<111>), silicon oxide, strained silicon, SOI, silicon germanium, doped or undoped polysilicon wafers, and the like. Generally, surfaces on which a spacer structure is formed may comprise regions of bare silicon, barrier material, low-k or high-k dielectric material, conductive material, and the like. Optionally, prior to forming the spacer structure, the substrate 200 may be pretreated by selectively performing processes such as polishing, annealing, baking, etching, reduction, oxidation, halogenation, hydroxylation, and the like. In one embodiment, the substrate 200 is a crystalline silicon wafer.

In the embodiment depicted in FIGS. 2A-D, the substrate 200 comprises at least one base structure over which the spacer structure is to be formed. In one embodiment, the base structure comprises a gate structure 201 (numbered in FIG. 2A only) of a transistor being fabricated. Illustratively, the gate structure 201 is disposed in region 230 above a channel region 221, a source region 222, and a drain region 223 of the transistor (regions 221-223 are depicted with broken lines). The gate structure 201 generally comprises a gate dielectric layer 202, a gate layer 204 and an optional metallic contact layer 206. The gate dielectric layer 202 may be formed to a thickness of about 10 to 60 Angstroms from, e.g., silicon oxide ($SiO_2$), silicon oxynitride (SiON), hafnium oxide ($HfO_2$), hafnium silicate ($HfSi_xO_y$, where x and y are integers), and the like, or a combination thereof. The gate layer 204 may be formed from polysilicon (Si) to a thickness of about 500-2000 Angstroms, and the contact layer 206 is typically formed to a thickness of about 100-500 Angstroms from tungsten (W), cobalt (Co), nickel (Ni), and the like. It is contemplated that other materials and thicknesses may be used to form the gate structure 201 used in connection with the spacer structures disclosed herein.

At step 106, a first layer comprising silicon nitride is deposited on the substrate. In the embodiment depicted in FIG. 2B, a first layer 212 is deposited on sidewalls of the gate structure 201 (identified in FIG. 2A) and exposed surfaces of the substrate 200 in regions 232. The first layer 212 comprises silicon nitride ($Si_3N_4$) and may be deposited to a thickness of about 20-1500 Angstroms. In one embodiment, first layer 212 is deposited to a thickness of about 50 Angstroms. It is contemplated that layers having other thicknesses may optionally be utilized.

The first layer 212 may be formed using the illustrative chemistries and processes described below. Optionally, the first layer 212 may be doped with other elements to control the final dielectric constant of the spacer structure. In one embodiment, the first layer 212 may be doped with at least one of boron (B), carbon (C), germanium (Ge), or hydrogen (H). Additional processes for forming silicon nitride and doped silicon nitride films are disclosed in U.S. patent application Ser. No. 11/245,373, filed on Oct. 6, 2005, by R. Suryanarayanan Iyer, et al., and entitled, "METHOD AND APPARATUS FOR THE LOW TEMPERATURE DEPOSITION OF DOPED SILICON NITRIDE FILMS," which is hereby incorporated by reference in its entirety.

In one embodiment, the first layer 212 may be formed using a mixture comprising a nitridation chemical and a silicon source chemical, each in a gaseous or liquid form. In one embodiment, the nitridation chemical comprises at least one of nitrogen ($N_2$), ammonia ($NH_3$), hydrazine ($N_2H_4$) and the like, and the silicon source chemical comprises at least one of bis(tertiary butylamino)silane (BTBAS), silane ($SiH_4$), disilane ($Si_2H_6$), dichlorosilane ($SiH_2Cl_2$), hexachlorodisilane ($Si_2Cl_6$), and the like.

In other embodiments, step 106 may use carbon-containing nitridation chemicals having a chemical formula $R(C)$—$C_xN_yR(N)$, where R(C) is hydrogen (H) or other hydrocarbon compound group, R(N) is nitrogen or other nitrogen containing compound group, and x and y are integers. Examples of suitable chemicals include $(CH_3)_3$—N, $H_3C$—$NH_2$, methylamine, $H_3C$—NH—$NH_2$, methylhydrazine, $(H_3C)$—N=N—H, and HC≡N, among other such chemicals.

In yet other embodiments, step 106 may use hydrogen-containing silicon source chemicals having chemical formulas $(SiR_3)_3$—N, $(SiR_3)_2$N—$N(SiR_3)_2$, or $(SiR_3)$N=$(SiR_3)$ N, wherein R is hydrogen (H), a hydrocarbon reagent, or a fragment consisting of methyl, ethyl, phenyl, tertiary, butyl and combinations thereof. In one embodiment, R contains hydrogen and is free of halogens. In another embodiment, R contains hydrogen and one or more halogen elements. Examples of suitable silicon source chemicals include $(SiH_3)_3$—N, $(SiH_3)_2$N—$N(SiH_3)_2$, $(SiH_3)$N=$(SiH_3)_2$, and trisilylamine, among other such chemicals. In addition, other source gases disclosed with respect to the other layer and steps described below may be utilized to form like materials in any of the layers described herein.

Doping chemicals may include, e.g., at least one of boron trichloride ($BCl_3$), borane ($BH_3$), diborane ($B_2H_6$), or other boron containing precursor as a source of boron, at least one of the carbon containing silicon precursors mentioned above as a source of carbon, at least one of germane ($GeH_4$) or digermane ($Ge_2H_6$) as a source of germanium, and at least one of hydrogen ($H_2$) or any of the hydrogen containing nitrogen or silicon precursors mentioned above as a source of hydrogen.

Selective control of process recipes using the above-disclosed chemistries allows for control of interface properties (e.g., stress, diffusion barrier characteristics, and the like) of the first layer 212 with respect to neighboring layers, as well as control of the dielectric constant of the layer 212 (and overall spacer stack). The first layer 212 may also be fabricated to have high etch selectivity to chemistries further used in post-spacer fabrication processes.

In one embodiment, the silicon nitride first layer 212 may be formed in an LPCVD reactor, such as a SiNgen® Plus 300 mm reactor, by providing ammonia (NH3) at about 10-15,000 sccm, and silane (SiH4) at about 1-100 sccm (i.e., a NH3:SiH4 flow ratio ranging from 1:10 to 15,000:1), while maintaining a substrate pedestal temperature of about 650-800° C. and a chamber pressure of about 10-350 Torr. The duration of the deposition process is about 10-600 sec. One specific process provides 10,000 sccm NH3, 17 sccm SiH4 (i.e., a NH3:SiH4 flow ratio of 588:1), while maintaining the substrate temperature at about 700° C. and the chamber pressure at about 240 Torr. Other examples of process conditions for depositing a doped silicon nitride first layer 212 are described in the previously incorporated U.S. patent application Ser. No. 11/245,373.

At step 108, a second layer comprising a silicon-based dielectric material is deposited over the first layer. The second layer may comprise silicon oxide ($SiO_2$) or silicon oxynitride (SiON). The oxide layer lowers the overall dielectric constant of the spacer. Alternatively, the second layer may comprise a boron (B) and/or carbon (C) and/or oxygen (O) containing silicon nitride ($Si_3N_4$) film in embodiments where spacer structures are desired having a low capacitance, for example as a spacer structure in a DRAM device. Spacer structures having a lower capacitance due to the boron and/or carbon and/or oxygen containing silicon nitride film of the second layer may be advantageously used in applications having adjacent metallic layers, such as DRAM applications, due to the barrier properties of the first layer (and a third layer, discussed below), which substantially isolate the boron, carbon, or oxygen present in the second layer from coming into contact with the adjacent metallic layers. The first layer may also be advantageously used to provide a barrier to stop the dopants from diffusing into the substrate.

In the embodiment depicted in FIG. 2C, a second layer 214 is deposited over the first layer 212. In one embodiment, the second layer 214 may comprise silicon oxide ($SiO_2$) or silicon oxynitride (SiON) and may be formed to a thickness of between about 20-1500 Angstroms. Alternatively, the second layer 214 may comprise a boron (B) and/or carbon (C) and/or oxygen (O) containing silicon nitride ($Si_3N_4$) film and may be formed to a thickness of between about 20-1500 Angstroms. In one embodiment, the thickness of the second layer 214 is 500 Angstroms. Generally, the second layer 214 is formed from a boron, and/or carbon and/or oxygen containing silicon nitride film when the gate structure 201 comprises the metallic contact layer 206.

Step 108 can be performed using, e.g., an LPCVD reactor. In one embodiment, the second layer 214 is deposited in-situ, i.e., in a processing chamber of the same reactor where the first layer 212 was deposited during preceding step 106.

A second layer comprising $SiO_2$ may be formed using chemicals and processes disclosed in U.S. Pat. No. 6,713,127, issued Mar. 30, 2004 to Subramony, et al. (hereinafter the '127 patent), which is hereby incorporated by reference in its entirety. For example, a second layer 214 comprising $SiO_2$ may be formed using silicon source gases (such as silane, disilane, methylsilane, halogenated silanes, and the like) and oxidation source gases (such as oxygen, nitrous oxide, ozone, tetraoxysilane (TEOS), and the like). Correspondingly, a second layer 214 comprising SiON may be deposited using the same chemicals as disclosed above for forming a silicon oxide layer along with a nitridation source gas, such as ammonia, hydrazine, and the like. Similar to the first layer 212, the second layer 214 comprising $SiO_2$ or SiON may optionally be doped. In one embodiment, the dopant gases discussed above in reference to step 106 may be used to dope the $SiO_2$ or SiON second layer 214 with at least one of carbon (C) or boron (B).

A second layer 214 comprising a boron and/or carbon and/or oxygen containing silicon nitride film may be formed using the silicon nitride chemistries described with respect to step 106, above, with the addition of doping chemicals such as the sources of carbon, oxygen, and boron disclosed above and in the previously incorporated U.S. patent application Ser. No. 11/245,373, and the '127 patent.

Using an LPCVD reactor, the $SiO_2$ second layer 214 may be formed by providing silane ($SiH_4$) at about 1-20 sccm, optionally with a nitrogen carrier gas at about 3,000-15,000 sccm, and nitrous oxide ($N_2O$) at about 1,000-10,000 sccm (i.e., a $SiH_4:N_2O$ flow ratio ranging from 1:50 to 1:10,000), while maintaining a substrate temperature of about 650-800° C., and a chamber pressure of about 10-350 Torr. The duration of the deposition process is about 10-600 sec. One specific process provides silane at 4.5 sccm, nitrous oxide at 3,000 sccm (i.e., a $N_2O:SiH_4$ flow ratio of 666:1), and nitrogen at about 12,000 sccm, while maintaining a substrate temperature of 675° C. and a pressure of 275 Torr. Other examples of process conditions for depositing a doped silicon oxide second layer 214 are described in the previously incorporated '127 Patent.

Alternatively, the SiON second layer 214 may be formed by providing silane ($SiH_4$) at about 1-20 sccm, optionally with a nitrogen carrier gas at about 3,000-15,000 sccm, and nitrous oxide ($N_2O$) at about 1,000-10,000 sccm (i.e., a $SiH_4:N_2O$ flow ratio ranging from 1:50 to 1:10,000), and a nitridation source gas, such as ammonia ($NH_3$) or hydrazine ($N_2H_4$) at about 1,000-10,000 sccm (i.e., a $SiH_4$:nitridation gas flow ratio ranging from 1:50 to 1:10,000), while maintaining a substrate pedestal temperature of about 650-800° C., and a chamber pressure of about 10-350 Torr. The duration of the deposition process is about 10 to 600 sec. One specific process provides silane at 4.5 sccm, nitrous oxide at 3,000 sccm (i.e., a $N_2O:SiH_4$ flow ratio of 666:1), and ammonia at about 3,000 sccm, and nitrogen at 12,000 sccm, while maintaining a substrate temperature of 675° C. and pressure of 275 Torr. Other examples of process conditions for depositing a doped silicon oxynitride second layer 214 are described in the previously incorporated '127 Patent.

In yet another embodiment, the $Si_3N_4$ second layer 214 may be formed using the process described above in reference to step 106 where doping is provided using the chemistries and processes described above with respect to the doped silicon nitride first layer 212.

At step 110, a third layer is formed atop the second layer to complete the spacer structure. The third layer generally comprises silicon nitride ($Si_3N_4$) and may be formed using the process described above in reference to step 106. The third layer may be formed to a thickness of between about 20-1500 Angstroms. In one embodiment, the thickness of the third layer is about 50 Angstroms. It is contemplated that the thickness of any or all of the first, second, and/or third layer may be adjusted based upon thermal budgets and the diffusivity of elements contained in the second layer that are undesirable to contact layers formed on the substrate adjacent to the spacer structure. For example, where the second layer comprises a carbon or oxygen containing silicon nitride film and there are adjacent metallic layers in the device being fabricated, for example a DRAM device, the thicknesses of the layers of the spacer structure may be adjusted based upon the diffusivity of carbon or oxygen at the temperatures and processing times that the spacer structure will undergo during processing, and ultimately, during use of the completed device. Typically, the overall spacer thickness is targeted between about 100-1500 Angstroms. In one embodiment, the total thickness is about 600 Angstroms.

In one embodiment, the third layer may be deposited in-situ, i.e., in a processing chamber of the same reactor where the first layer and the second layer were deposited during steps 106 and 108, respectively. In the embodiment depicted in FIG. 2D, a third layer 216 is deposited on the second layer 214. Together, the layers 212, 214, and 216 form a spacer structure 240.

Upon completion of step 110, at step 112, method 100 ends. In the manufacture of field effect transistors, the method 100 advantageously utilizes characteristics of component layers and forms spacer structures having controlled interfacing properties, stress, diffusion barrier characteristics, and capacitance. The spacer structures may advantageously be formed in a single processing reactor, thereby preventing contamination of the spacer structure layers.

After completion of the spacer structure, additional processing may continue in the same or other process chambers to complete the formation of various devices on the substrate. For example, FIG. 2D depicts, in broken lines for illustrative purposes, an etch stop layer 218, source and drain plugs 208, 210, and a pre-metal dielectric layer 220 that may be sequentially formed on the substrate 200 after forming the spacer structure 240 to continue fabrication of a FET device.

Figure 3:
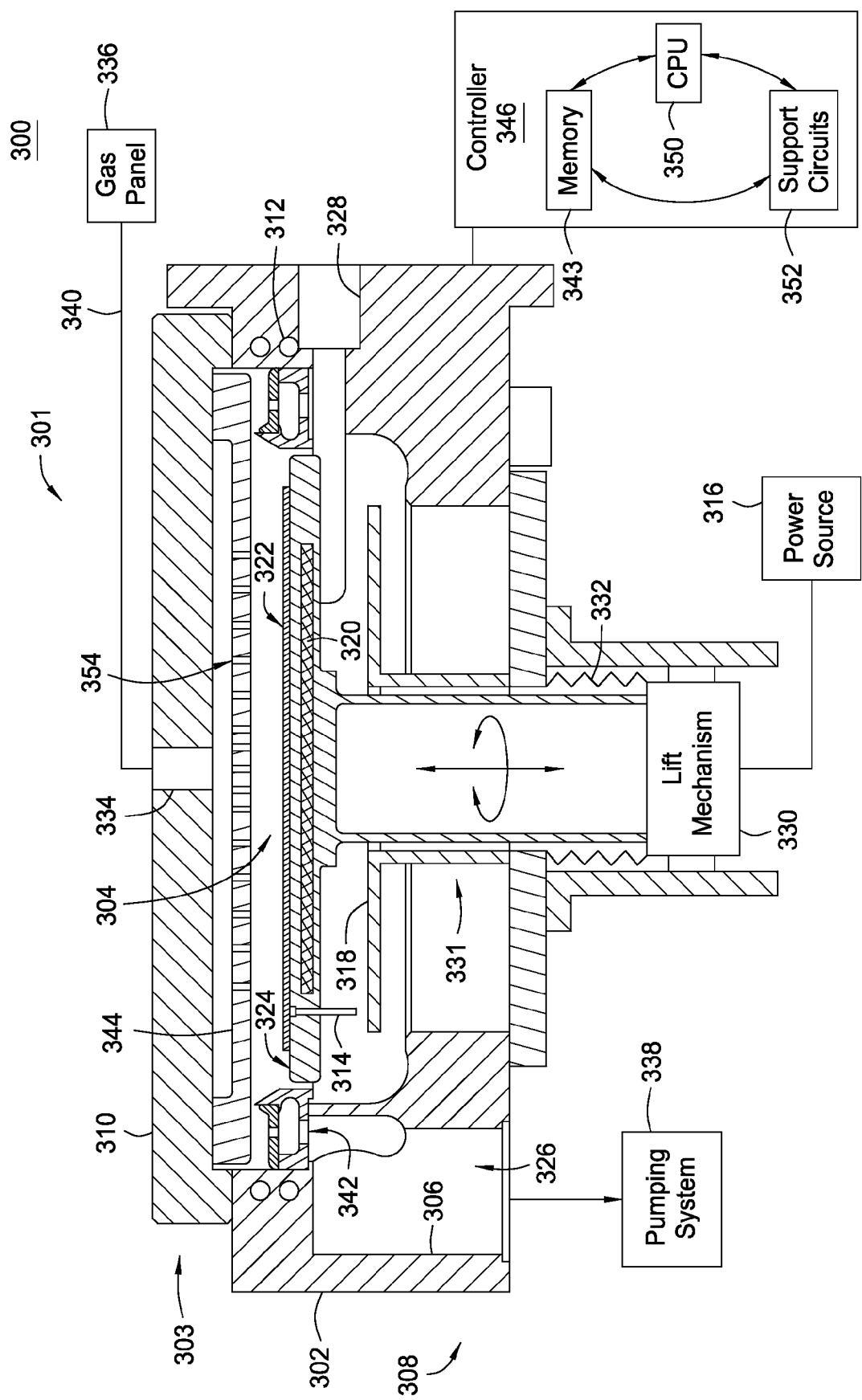
FIG. 3 depicts a schematic diagram of an exemplary CVD reactor of the kind that may be used to practice portions of the method of FIG. 1.

FIG. 3 depicts a schematic diagram of one exemplary LPCVD reactor 300 that may be used to practice portions of the method 100 of FIG. 1. Other examples of suitable LPCVD reactors are described in U.S. patent application Ser. No. 10/911,208, filed Aug. 4, 2004 by Iyer, et al., and U.S. patent application Ser. No. 11/147,938, filed Jun. 8, 2005 by Smith, et al. In the embodiment depicted in FIG. 3, the reactor 300 comprises a processing chamber 301, a pumping system 338, a gas panel 336, a power source 316, and a controller 346.

The processing chamber 301 generally includes an upper assembly 303, a bottom assembly 308, and a pedestal lift assembly 331. The upper assembly 303 generally comprises a lid 310 having an inlet port 334 and a showerhead 344. The bottom assembly 308 houses a substrate support pedestal 324 and comprises a chamber body 302 having a wall 306. A substrate access port 328 is formed in the chamber body 302 to facilitate entry and egress of a substrate 322 into and out of the processing chamber 301. The pedestal lift assembly 331 is coupled to the substrate support pedestal 324 and comprises a lift mechanism 330, a lift plate 318 and a set of lift pins 314.

The substrate support pedestal 324 is disposed in an internal volume 304 of the processing chamber 301 and, during processing, supports the substrate 322. The pedestal 324 includes a heater 320 configured to regulate the temperature of the substrate 322 and/or temperature in the internal volume 304. The heater 320 is coupled to the power source 316 and capable of maintaining the substrate 322 at a temperature of up to about 800° C.

The showerhead 344 provides, through a plurality of openings 354, distribution of gases or vapors delivered from the gas panel 336. Size, geometry, number, and location of the openings 354 are selectively chosen to facilitate a predefined pattern of gas/vapor flow to the substrate 322.

The gas panel 336 provides process chemicals, in liquid and/or gaseous form, to the processing chamber 301. The gas panel 336 is coupled to the lid 310 using a plurality of gas lines 340. Each gas line 340 may be selectively adapted for transferring specific chemical(s) from the gas panel 336 to the inlet port 334, as well as be temperature controlled.

In operation, the pedestal lift assembly 331 controls the elevation of the pedestal 324 between a processing position (as shown in FIG. 3) and a lowered position from which the substrate 322 may transported, through the substrate access port 328, into and out of the processing chamber 301. The assembly 301 is sealingly coupled to the chamber body 302 using a flexible bellows 332 and, optionally, is configured to rotate the substrate support pedestal 324.

The wall 306 may be thermally regulated. In one embodiment, a plurality of conduits 312 are disposed in the wall 306 and configured to circulate a heat transfer fluid regulating the temperature of the wall.

The pumping system 338 is coupled to a pumping port 326 formed in the wall 306. The pumping system 338 generally includes a throttle valve and one or more pumps arranged to control the pressure in the internal volume 304. Gases flowing out of the processing chamber 301 are routed through a pumping ring 342 to enhance gas flow uniformity across the surface of the substrate 322. One such pumping ring is described in U.S. patent Ser. No. 10/911,208, filed Oct. 4, 2004, by Iyer, et al., and entitled "Thermal Chemical Vapor Deposition of Silicon Nitride Using BTBAS Bis (Tertiary-Butylamino Silane) in a Single Wafer Chamber," which is herein incorporated by reference.

In alternate embodiments (not shown), the reactor 300 may comprise a photoexcitation system delivering radiant energy to the substrate 322 through windows in the lid 310, as well as a remote plasma source coupled to the inlet port 334.

The system controller 346 generally comprises a central processing unit (CPU) 350, a memory 343, and support circuits 352 and is coupled to and controls modules and apparatuses of the reactor 300. In operation, the controller 346 directly controls modules and apparatus of the system 300 or, alternatively, administers computers (and/or controllers) associated with these modules and apparatuses.

The invention may be practiced using other processes and/or processing apparatuses where parameters are adjusted to achieve acceptable characteristics by those skilled in the art without departing from the spirit of the invention. Although the forgoing discussion referred to fabrication of a spacer structure of a field effect transistor, fabrication of other devices and structures used in integrated circuits can also benefit from the invention.

While the foregoing is directed to embodiments of the present invention, other and further embodiments of the invention may be devised without departing from the basic scope thereof, and the scope thereof is determined by the claims that follow.

What is claimed is:

1. A method for fabricating a spacer structure on a semiconductor substrate, comprising:
   providing a substrate containing a base structure over which the spacer structure is to be formed; and
   forming the spacer structure by:
   (a) depositing a first layer comprising silicon nitride on the base structure;
   (b) depositing a second layer comprising a silicon-based dielectric material on the first layer; and
   (c) depositing a third layer comprising silicon nitride on the second layer;
   wherein steps (a)-(c) are performed in a single processing reactor, and wherein step (b) further comprises maintaining a vacuum while depositing the second layer.

2. The method of claim 1, wherein the first layer is about 20-1500 Angstroms thick.

3. The method of claim 1, wherein the first layer further comprises:
   at least one dopant comprising boron, carbon, germanium, or hydrogen.

4. The method of claim 1, wherein the silicon-based dielectric material of the second layer comprises silicon oxide or silicon oxynitride.

5. The method of claim 4, wherein the second layer is about 20-1500 Angstroms thick.

6. The method of claim 4, wherein the base structure is a gate structure of a transistor.

7. The method of claim 6, wherein step (a) further comprises depositing the first layer on sidewalls of the gate structure and regions of the substrate proximate the gate structure.

8. The method of claim 6, wherein the gate structure comprises a gate dielectric layer and a gate layer.

9. The method of claim 8, wherein the gate dielectric layer comprises at least one film formed from silicon oxide, silicon oxynitride, hafnium oxide, or hafnium silicate.

10. The method of claim 8, wherein the gate layer is formed from polysilicon.

11. The method of claim 1, wherein the silicon-based dielectric material of the second layer is formed from silicon nitride doped with at least one of boron, carbon, or oxygen.

12. The method of claim 11, wherein the second layer is about 20-1500 Angstroms thick.

13. The method of claim 11, wherein the second layer is about 500 Angstroms thick.

14. The method of claim 11, wherein the base structure comprises an exposed metallic layer.

15. The method of claim 1, wherein the third layer is about 20-1500 Angstroms thick.

16. The method of claim 1, wherein the spacer structure has a total thickness of about 100-1500 Angstroms.

17. The method of claim 1, wherein the spacer structure has a total thickness of about 600 Angstroms.

18. The method of claim 1, wherein the thickness of at least one of the first through third layers is varied in response to the diffusivity of elements contained in the second layer at a given thermal budget.

19. The method of claim 1, wherein step (b) further comprises depositing the second layer via at least one of a chemical vapor deposition process or an atomic layer deposition process.

20. The method of claim 1, wherein steps (a) through (c) are performed under continuous vacuum conditions.

21. A method for fabricating a spacer structure on a semiconductor substrate, comprising:
providing a substrate containing a base structure over which the spacer structure is to be formed; and
forming the spacer structure by:
(a) depositing a first layer comprising silicon nitride on the base structure;
(b) depositing a second layer comprising a silicon-based dielectric material on the first layer; and
(c) depositing a third layer comprising silicon nitride on the second layer;
wherein steps (a)-(c) are performed in a single processing reactor under continuous vacuum conditions.

* * * * *